United States Patent
Tajima (10) Patent No.: US 8,791,476 B2
(45) Date of Patent: Jul. 29, 2014

(54) ACTIVE MATRIX SUBSTRATE HAVING A MEANDER STRUCTURE

(75) Inventor: Yoshimitsu Tajima, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 316 days.

(21) Appl. No.: 13/393,594

(22) PCT Filed: May 10, 2010

(86) PCT No.: PCT/JP2010/057905
§ 371 (c)(1),
(2), (4) Date: Mar. 1, 2012

(87) PCT Pub. No.: WO2011/030584
PCT Pub. Date: Mar. 17, 2011

(65) Prior Publication Data
US 2012/0181556 A1  Jul. 19, 2012

(30) Foreign Application Priority Data
Sep. 11, 2009 (JP) ................. 2009-210711

(51) Int. Cl.
| | | |
|---|---|---|
| H01L 33/00 | (2010.01) | |
| H01L 21/82 | (2006.01) | |
| G02F 1/1345 | (2006.01) | |
| H01L 27/02 | (2006.01) | |
| H01L 33/62 | (2010.01) | |
| H01L 27/32 | (2006.01) | |
| H01L 27/12 | (2006.01) | |
| H01L 33/38 | (2010.01) | |
| H01L 27/10 | (2006.01) | |

(52) U.S. Cl.
CPC .......... *G02F 1/1345* (2013.01); *H01L 27/0248* (2013.01); *H01L 27/1214* (2013.01); *H01L 33/62* (2013.01); *H01L 33/38* (2013.01); *H01L 27/10* (2013.01); *H01L 27/3244* (2013.01); *G02F 2202/22* (2013.01)
USPC ............... 257/91; 257/99; 257/173; 438/135; 438/149

(58) Field of Classification Search
CPC ..................... H01L 29/41733; H01L 27/0248; H01L 27/3244; H01L 27/10; H01L 27/1214; H01L 33/38; H01L 33/62
See application file for complete search history.

(56) References Cited

U.S. PATENT DOCUMENTS 6,396,554 B1 * 5/2002 Matsuda ................ 349/139
6,426,782 B1   7/2002 Nakajima
(Continued)

FOREIGN PATENT DOCUMENTS

JP   3-175425 A   7/1991
JP   7-202133 A   8/1995
(Continued)

OTHER PUBLICATIONS

Official Communication issued in International Patent Application No. PCT/JP2010/057905, mailed on Jul. 20, 2010.

*Primary Examiner* — Alonzo Chambliss
(74) *Attorney, Agent, or Firm* — Keating & Bennett, LLP (57) ABSTRACT

The present invention provides an active matrix substrate and a display device that have sufficient resistance to a surge current without formation of a short ring and that enable narrowing of a picture-frame region. The present invention is an active matrix substrate on which a plurality of pixels are formed in a matrix shape. The active matrix substrate includes, on one principal surface side of the substrate: a terminal; a semiconductor element; wiring that is formed in a picture-frame region of the substrate and that connects the terminal and the semiconductor element; and an annular conductive portion formed through an insulation layer on at least one of an upper layer side and a lower layer side of the wiring. The wiring comprises a meander structure including a meander-shaped portion. A portion of the conductive portion is disposed along the meander-shaped portion.

11 Claims, 8 Drawing Sheets

(56) References Cited

U.S. PATENT DOCUMENTS

| | | |
|---|---|---|
| 2007/0019353 A1 | 1/2007 | Ishii et al. |
| 2008/0062666 A1 | 3/2008 | Lim et al. |

FOREIGN PATENT DOCUMENTS

| | | |
|---|---|---|
| JP | 11-84429 A | 3/1999 |
| JP | 11-87606 A | 3/1999 |
| JP | 2001-209026 A | 8/2001 |
| JP | 2002-40462 A | 2/2002 |
| JP | 2002-83968 A | 3/2002 |
| JP | 2007-60892 A | 3/2007 |
| JP | 2008-72084 A | 3/2008 |
| JP | 2008-78041 A | 4/2008 |
| JP | 2009-199853 A | 9/2009 |

* cited by examiner

ACTIVE MATRIX SUBSTRATE HAVING A MEANDER STRUCTURE

TECHNICAL FIELD

The present invention relates to an active matrix substrate and a display device. More specifically, the present invention relates to an active matrix substrate that is suitable as an active matrix substrate for which a countermeasure to static electricity that arises during a manufacturing process is required, and to a display device that includes the active matrix substrate.

BACKGROUND ART

In conventional active matrix liquid crystal display devices, respectively independent pixels are arranged in a matrix shape in a liquid crystal display panel, and a pixel electrode and a switching element are respectively provided in each of the pixels.

In the above described liquid crystal display devices, a driving voltage is applied to the pixel electrode through the switching element, and liquid crystal is driven by means of a difference in potential between the pixel electrode and a common electrode that is arranged opposite the pixel electrode through the liquid crystal. Further, an image is displayed on a liquid crystal display panel by optically modulating transmitted light or reflected light.

In the above described liquid crystal display devices, a thin film transistor (TFT) is mainly used as a switching element. A liquid crystal display panel that uses TFTs includes an active matrix substrate (hereunder, an "active matrix substrate" is also referred to as an "array substrate") on which TFTs are formed, and in view of the quality and cost thereof, active matrix substrates are currently used most widely in the above described liquid crystal display devices.

Figure 10:
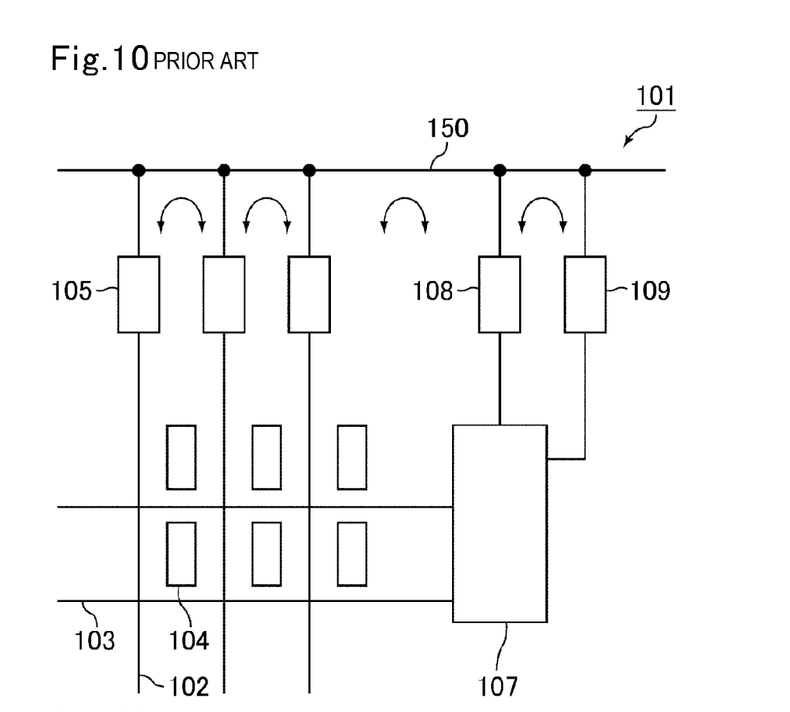
FIG. 10 is a planar schematic view showing a configuration of a conventional active matrix substrate.

As shown in FIG. 10, in a conventional array substrate 101, normally, source wiring 102 and gate wiring 103 are arranged vertically and horizontally. Further, an interlayer insulation layer is formed between pixel electrodes 104, and the gate wiring 103 and source wiring 102. An input terminal 105 is connected to the source wiring 102. The gate wiring 103 is connected to power supply voltage supplying terminals 108 and 109 through a logic circuit 107.

In this connection, a switching element such as a TFT is generally weak against a strong electric field. Therefore, destruction of a TFT or a defect in the properties of a TFT or the like may be caused by a surge current that results from the build-up and discharge of static electricity or the like in a TFT manufacturing process, a process of rubbing an alignment layer, a process of mounting an external component and the like. Specifically, static electricity builds up over a long period in a semiconductor layer inside a TFT, and the threshold value of the TFT may be shifted due to the semiconductor layer being exposed in a high voltage state. A pixel that is affected in this manner is recognized as a defective pixel. Further, if a voltage that exceeds an allowable withstand voltage by a large margin is applied to the source wiring 102 and/or the gate wiring 103, a surge current may be generated to a degree that causes dielectric breakdown of an insulation layer and/or a semiconductor film, which may result in a display failure caused by a leak and/or a property defect.

To avoid such a situation, generally, during a process of manufacturing an array substrate, all input terminals are short-circuited with a conductive film pattern referred to as a "short ring" 150, and care is taken so that a state in which elements or wiring are exposed to a high voltage does not continue for a long time. However, if the short ring 150 is formed using a transparent conductive film that is the same as the pixel electrode 104, inspection of the array substrate can not be carried out after patterning of the transparent conductive film, and inspection and correction of a defect relating to the transparent conductive film can not be performed. Therefore, in the conventional active matrix liquid crystal display devices, there is room for improvement with respect to further enhancing the display quality and yield. Note that, the short ring 150 is ultimately removed by splitting up the array substrate to divide the array substrate into respective display devices (panels).

It is conceivable to utilize the following technology to protect a switching element from a surge current without using the short ring 150.

For example, an RLC circuit has been disclosed (for example, see Patent Document 1) that includes a semiconductor substrate in which a monolayer of an n region or a p region is formed on a surface side, a non-spiral-shaped first electrode that is formed on the semiconductor substrate, a non-spiral-shaped second electrode that is formed so as to be approximately coplanar with and parallelly adjacent to the first electrode, and an insulating layer that is formed between at least one of the first and second electrodes and the semiconductor substrate, wherein inductors formed by the first electrode and the second electrode, respectively, and a capacitor formed between the inductors are present in a distributed constant manner, and at least one of the first electrode and the second electrode is used as a signal input/output route.

Further, an input/output protection circuit of a liquid crystal display device has been disclosed (for example, see Patent Document 2) in which switching elements used for driving respective pixels are constituted by N-type thin film transistors (N-type LDD structure TFTs) that have a lightly doped drain structure (LDD structure), which includes: a first input/output protection transistor that does not have the LDD structure and is constituted by an N-type thin film transistor (N-type non-LDD structure TFT) that has a breakdown voltage and a hold voltage that are lower than the N-type LDD structure TFT; a second input/output protection transistor that is constituted by a P-type thin film transistor (P-type non-LDD structure TFT) that does not have the LDD structure and has a breakdown voltage and a hold voltage that are lower than the N-type LDD structure TFT, and that is complimentarily connected to the first input/output protection transistor; and a resistance element for by-passing an overcurrent, that is formed between the respective source electrodes of the first and second input/output protection transistors and an external electrode of the liquid crystal display device.

Furthermore, an electrostatic protection circuit has been disclosed (for example, see Patent Document 3) that includes: a first MOS transistor in which a first drain is connected to an input terminal of the circuit to be protected, and a first gate and a first source are connected to a grounding terminal; and a second MOS transistor in which a second gate is connected to a grounding terminal, a second source is connected to the input terminal, and a second drain is connected to a power source terminal of the circuit to be protected through an impedance including a resistance and an inductance.

PRIOR ART REFERENCES

Patent Documents

[Patent Document 1] JP 07-202133A
[Patent Document 2] JP 2002-83968A
[Patent Document 3] JP 11-87606A

SUMMARY OF THE INVENTION

Problems to be Solved by the Invention

However, a huge capacity is required in order to obtain a sufficient effect using the technology disclosed in Patent Document 1.

Further, according to Patent Document 2 and 3, inductance elements are disposed in a circular shape on the outer circumference of the substrate. As a result, there is an enlargement of region that is not related to the display (hereunder, also referred to as "picture-frame region"), and this goes against the current trend of weight reduction, thinning, and miniaturization.

The present invention has been made in view of the present situation as described above, and an object of the present invention is to provide an active matrix substrate that has sufficient resistance to a surge current without forming a short ring and which enables narrowing of a picture-frame region, as well as a display device.

Means for Solving the Problems

The inventors have conducted various studies with respect to array substrates that have sufficient resistance to a surge current without forming a short ring and which enable narrowing of a picture-frame region, and have focused attention on wiring that is formed in the picture-frame region of the array substrates and which connects a terminal such as an input terminal and a semiconductor element such as a TFT. The inventors found that by forming an annular conductive portion through an insulation layer on at least one of an upper layer side and a lower layer side of the wiring, forming a meander structure including a meander-shaped portion in the wiring, and disposing a part of the conductive portion along the meander-shaped portion, even if a surge current flows into the wiring, an induced current can be caused to flow through the conductive portion so that a magnetic field is generated that inhibits the flow of the surge current, and as a result, the occurrence of a dielectric breakdown caused by a surge current can be suppressed without forming a short ring, and enlargement of the picture-frame region can be suppressed. Having realized that this idea can beautifully solve the above problem, the inventors have arrived at the present invention.

More specifically, the present invention provides an active matrix substrate (hereunder, also referred to as "first active matrix substrate of the present invention") on which a plurality of pixels are formed in a matrix shape, including, on one principal surface side of the substrate: a terminal, a semiconductor element, wiring that is formed in a picture-frame region of the substrate and that connects the terminal and the semiconductor element, and an annular conductive portion formed through an insulation layer on at least one of an upper layer side and a lower layer side of the wiring; wherein: the wiring comprises a meander structure including a meander-shaped portion; and a part of the conductive portion is disposed along the meander-shaped portion.

The configuration of the first active matrix substrate of the present invention is not especially limited by other components as long as it essentially includes the above described components.

The present invention also provides an active matrix substrate (hereunder, also referred to as "second active matrix substrate of the present invention") on which a plurality of pixels are formed in a matrix shape, including, on one principal surface side of the substrate: a terminal, a semiconductor element, wiring that is formed in a picture-frame region of the substrate and that connects the terminal and the semiconductor element, and auxiliary wiring that is formed through an insulation layer on an upper layer or lower layer side of the wiring; wherein: the auxiliary wiring is connectable with the wiring at two different points; the wiring and the auxiliary wiring each comprise a meander structure including a meander-shaped portion between the two points; the meander-shaped portion of the wiring and the meander-shaped portion of the auxiliary wiring are arranged with a same or substantially same cycle; the meander-shaped portion of the auxiliary wiring is disposed in an inverse direction relative to the meander-shaped portion of the wiring from one of the two points to another of the two points; and a part of the meander-shaped portion of the auxiliary wiring is disposed along the meander-shaped portion of the wiring. Therefore, even if a surge current flows into the wiring, a surge current can also be caused to flow through the auxiliary wiring, and a magnetic field can be generated in each of the wiring and the auxiliary wiring that inhibits the flow of the other surge current. Thus, a surge current can be suppressed without forming a short ring. Furthermore, enlargement of a picture-frame region can be suppressed.

The configuration of the second active matrix substrate of the present invention is not especially limited by other components as long as it essentially includes the above described components.

Preferable embodiments of the first and/or second active matrix substrate of the present invention are mentioned in more detail below. The following embodiments may be employed in combination.

In the first and second active matrix substrate of the present invention, although the type of the terminal is not particularly limited, an input terminal that inputs an image signal or a scanning signal and a power supply voltage supplying terminal that supplies a power supply voltage can be mentioned as suitable examples thereof.

In the first and second active matrix substrate of the present invention, although the type of the semiconductor element is not particularly limited, a TFT can be mentioned as a suitable example thereof.

In the first and second active matrix substrate of the present invention, although the type of the wiring is not particularly limited, a lead wire that connects source wiring or gate wiring to an input terminal, and a power supply line can be mentioned as suitable examples thereof.

The first active matrix substrate of the present invention may further include a power supply line to which a power supply voltage is applied, and a field-effect transistor that connects the wiring and the conductive portion, wherein: the field-effect transistor is controlled by a gate of the transistor being connected to the power supply line; and the field-effect transistor has a switchable function such that the field-effect transistor enters an off state in a state in which the power supply voltage is not applied and enters an on state in a state in which the power supply voltage is applied. Therefore, since the conductive portion can be placed in an electrically insulated state during a process of manufacturing the array substrate, as described above, occurrence of a dielectric breakdown caused by a surge current can be suppressed, and on the other hand, since the conductive portion and the wiring can enter an electrically conductive state when driving the array substrate, the conductive portion can be utilized as auxiliary wiring of the wiring, and as a result, a decline in the display quality due to delay of a display signal can be suppressed.

Preferably, the first active matrix substrate of the present invention includes a plurality of the conductive portions, wherein: the plurality of conductive portions include a conductive portion formed on an upper layer side of the wiring and a conductive portion formed on a lower layer side of the wiring; and the conductive portion formed on the upper layer side of the wiring and the conductive portion formed on the lower layer side of the wiring are alternately arranged along the wiring. Therefore, the above described surge current suppression effect can be more effectively exerted. Thus, the plurality of conductive portions may be alternately arranged on the upper layer or lower layer side of the wiring.

By disposing a ferromagnetic material in a region surrounded by the meander-shaped portion, the aforementioned surge current suppression effect can be more effectively exerted. Thus, in the first active matrix substrate of the present invention, a portion that is surrounded by the meander-shaped portion may include a ferromagnetic material. Further, in the second active matrix substrate of the present invention, a portion that is surrounded by the meander-shaped portion of the wiring may include a ferromagnetic material.

In the first active matrix substrate of the present invention, a region (portion) that is surrounded by the conductive portion may include a ferromagnetic material. Thus, a large amount of induced current can be conducted to the conductive portion, and an effect that reduces energy of a surge current can be enhanced.

In the second active matrix substrate of the present invention, a region (portion) that is surrounded by the auxiliary wiring may include a ferromagnetic material. Thus, the above described surge current suppression effect can be more effectively exerted.

In the first active matrix substrate of the present invention, a configuration may be adopted in which the field-effect transistor is of an N-channel type, the power supply line includes a low-voltage side power supply line and a high-voltage side power supply line, and the gate is connected to the high-voltage side power supply line.

In the first active matrix substrate of the present invention, a configuration may be adopted in which the field-effect transistor is of a P-channel type, the power supply line includes a low-voltage side power supply line and a high-voltage side power supply line, and the gate is connected to the low-voltage side power supply line.

The second active matrix substrate of the present invention may further include two switches that connect the wiring and the auxiliary wiring at the two points, wherein a connection by the two switches has a switchable function such that an on state is entered when a surge current flows therein, and an off state is entered when at least one of a power supply voltage and a signal is input. Thus, when a surge current flows into the wiring, a surge current also flows into the auxiliary wiring, and hence surge currents can be suppressed as described above. Further, when driving the array substrate normally, the two switches enter an off state and the auxiliary wiring can be placed in an electrically insulated state. Consequently, at a time of normal driving, since the occurrence of a signal delay in the auxiliary wiring can be alleviated, excellent display properties can be realized.

In the second active matrix substrate of the present invention, the meander-shaped portion of the auxiliary wiring is mirror symmetrical with respect to the meander-shaped portion of the wiring so as to form a pair therewith, or the meander-shaped portion of the auxiliary wiring is arranged with the same cycle as the meander-shaped portion of the wiring and manifests a similar function, and preferably the meander-shaped portion of the auxiliary wiring has a meander shape similar to the meander-shaped portion of the wiring in which a flat surface shape is deformed. More preferably, the meander-shaped portion of the auxiliary wiring and the meander-shaped portion of the wiring that corresponds thereto are arranged antisymmetrically as in a case where, for example, the palm of the right hand is overlaid on the back of the left hand. Thus, preferably the meander-shaped portion of the auxiliary wiring is completely or substantially mirror symmetrical with respect to the meander-shaped portion of the wiring. As a result, the aforementioned surge current suppression effect can be exerted more effectively. From a similar viewpoint, the meander-shaped portion of the auxiliary wiring may symmetrically meander with respect to the meander-shaped portion of the wiring.

In the second active matrix substrate of the present invention, a semiconductor switch is suitable as the two switches. Thus, since the two switches can be formed utilizing a TFT formation process, the manufacturing process can be simplified.

The present invention also provides a display device that includes the first active matrix substrate of the present invention.

The present invention further provides a display device that includes the second active matrix substrate of the present invention.

Effects of the Invention

According to the first and second active matrix substrate of the present invention and the display device of the present invention, it is possible to realize sufficient resistance to a surge current without forming a short ring, and to narrow a picture-frame region.

MODES FOR CARRYING OUT THE INVENTION

The present invention will be mentioned in more detail in the following embodiments, but is not limited to these embodiments.

Note that, in FIGS. 3, 4, 7 and 9, a broken line indicates a semiconductor layer, a thick line indicates a second conductive film, and a thick broken line indicates a transparent conductive film.

Embodiment 1

Figure 1:
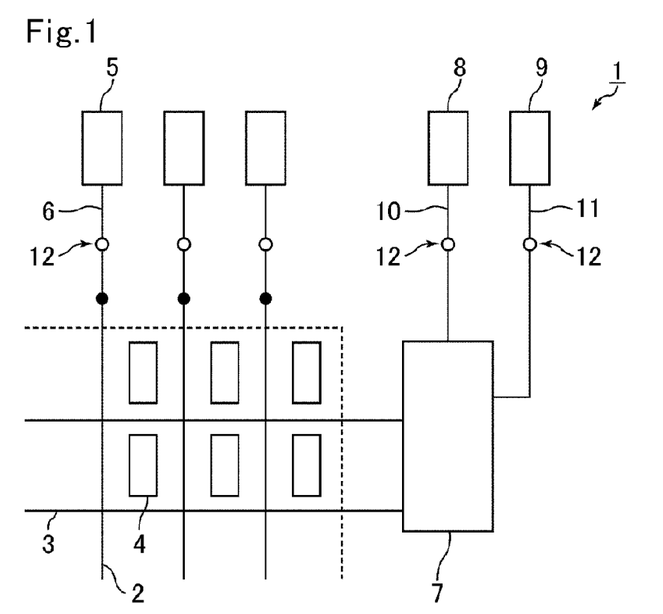
FIG. 1 is a planar schematic view showing a configuration of an active matrix substrate according to Embodiment 1.

As shown in FIG. 1, in a display region of an active matrix substrate (array substrate 1) of Embodiment 1, a plurality of source wirings 2 and a plurality of gate wirings 3 are arranged to intersect in a matrix shape through a first interlayer insulation layer. TFTs for pixel switching are arranged at portions at which the source wiring 2 and the gate wiring 3 intersect, and a drain of each TFT is connected to a pixel electrode 4. The pixel electrode 4 faces a common electrode through a liquid crystal layer. The source wiring 2 inputs a signal (image signal) of an image to be displayed on a liquid crystal display panel into a pixel. The gate wiring 3 sequentially inputs scanning signals that control the TFTs from a logic circuit 7 into the TFTs.

A plurality of input terminals 5 are arranged in a picture-frame region on an extension of the source wiring 2, and the source wirings 2 and the input terminals 5 are connected to each other through lead wires 6 formed in the picture-frame region. The logic circuit 7 is formed in a picture-frame region on an extension of the gate wiring 3, and is connected to the gate wiring 3. The logic circuit 7 includes a plurality of semiconductor elements such as TFTs, and functions as a gate driver. Power supply voltage supplying terminals (hereunder, also referred to as "power supply terminal") 8 and 9 and a control terminal (not shown) are also disposed in the picture-frame region. The power supply terminals 8 and 9 supply a power supply voltage to TFTs for pixel switching and semiconductor elements included in the logic circuit 7 and the like, and also control the power supply voltage. The power supply terminal 8 and the logic circuit 7 are connected to each other through a high-voltage side power supply line 10 formed in the picture-frame region. The power supply terminal 9 and the logic circuit 7 are connected to each other through a low-voltage side power supply line 11 formed in the picture-frame region. A power supply voltage (GVdd) applied to the low-voltage side power supply line 11 is lower than a power supply voltage (Gdd) applied to the high-voltage side power supply line 10. For example, the power supply voltage applied to the low-voltage side power supply line 11 is approximately −5V, and the power supply voltage applied to the high-voltage side power supply line 10 is approximately 10V. A protection circuit 12 is formed in each lead wire 6 and the power supply lines 10 and 11.

The array substrate 1 has an insulating substrate such as a glass substrate as a base material. A semiconductor layer such as a silicon layer; a gate insulator formed of an $SiO_2$ film, an $SiN_x$ film, an SiNO film or the like; a first conductive film formed of tantalum (Ta), tungsten (W), titanium (Ti), molybdenum (Mo) or the like; a first interlayer insulation layer formed of an $SiO_2$ film, an $SiN_x$ film, an SiNO film or the like; a second conductive film formed of aluminium (Al), copper (Cu), silver (Ag) or the like; a second interlayer insulation layer formed of a resin material or a spin-on glass material or the like; and a transparent conductive film formed of an indium-tin-oxide compound (ITO) or the like and formed in this order on the insulating substrate.

The gate wiring 3 is formed from the first conductive film. The source wiring 2, the lead wires 6, and the power supply lines 10 and 11 are formed from the second conductive film, and the pixel electrodes 4 are formed from the transparent conductive film.

The structure of the protection circuit 12 is described in detail hereunder.

Figure 2:
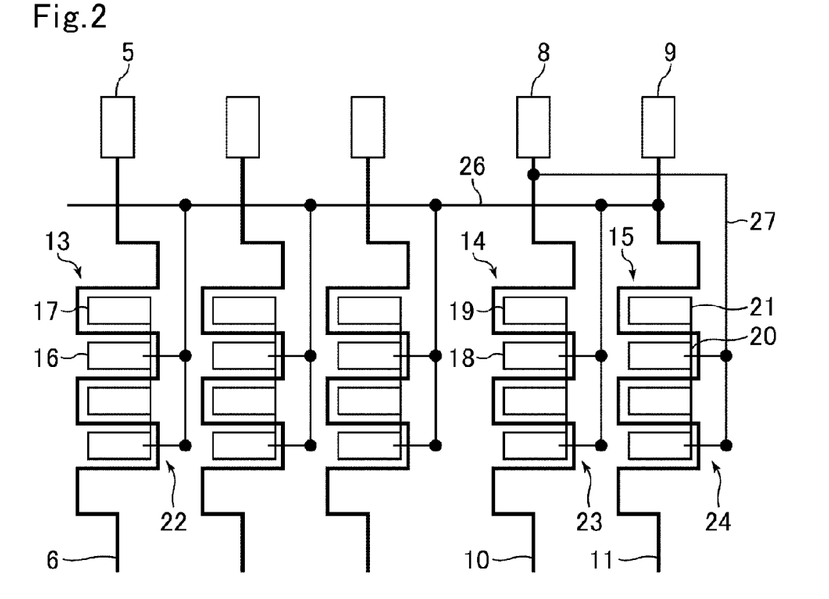
FIG. 2 is a planar schematic view showing a configuration of a picture-frame region of the active matrix substrate according to Embodiment 1.
Figure 3:
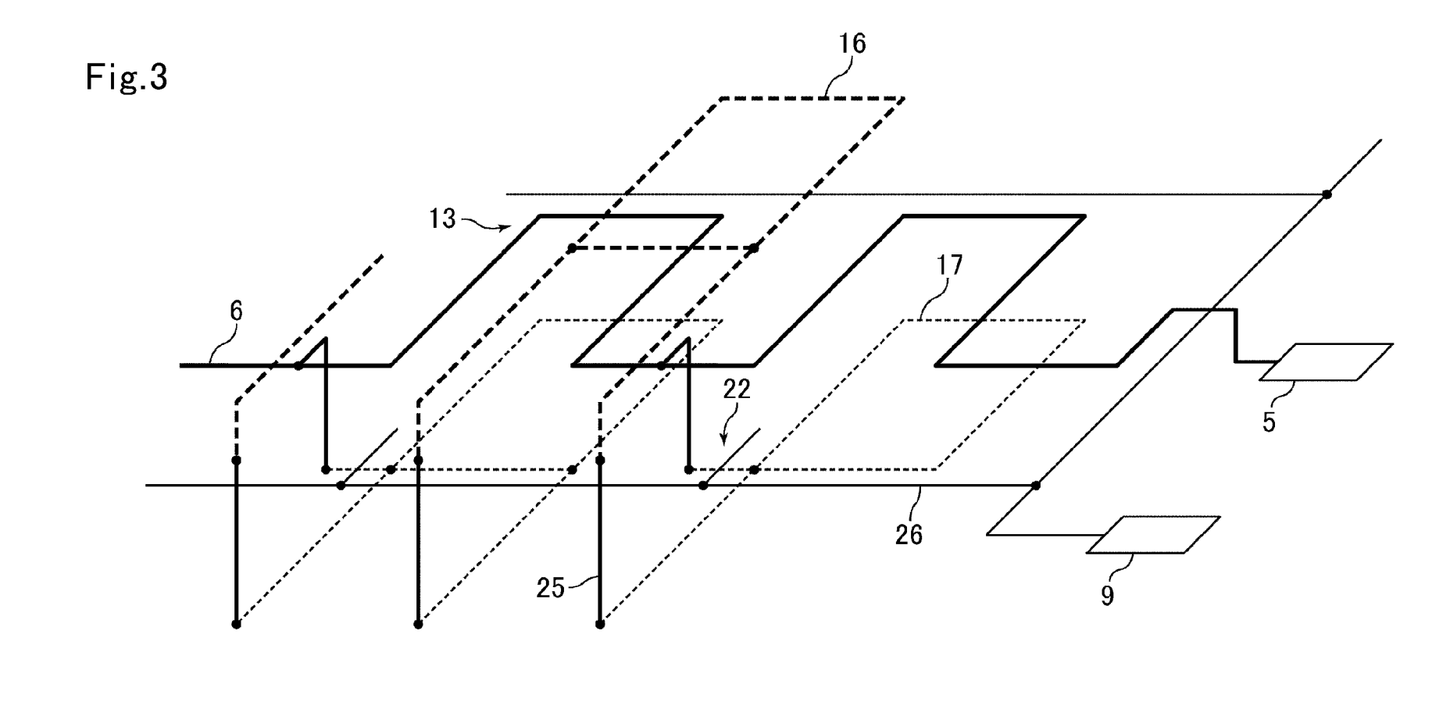
FIG. 3 is a perspective schematic view showing the configuration of the picture-frame region of the active matrix substrate according to Embodiment 1.

As shown in FIGS. 2 and 3, each lead wire 6 and the power supply lines 10 and 11 include a meander-shaped pattern (meander structure), and have meander-shaped portions 13, 14 and 15, respectively. The meander-shaped portions 13 to 15 meander in the manner of a square wave.

A plurality of conductive portions 16, 18 and 20 are formed through the second interlayer insulation layer on the upper layer of the meander-shaped portions 13 to 15. A plurality of conductive portions 17, 19 and 21 are formed through the gate insulator and the first interlayer insulation layer on the lower layer of the meander-shaped portions 13 to 15. The conductive portions 16 to 21 are annular (more specifically, quadrate) closed patterns, of which the conductive portions 16, 18 and 20 are formed from the transparent conductive film and the conductive portions 17, 19 and 21 are formed from an impurity diffusion layer of the semiconductor layer. The conductive portions 16 to 21 are formed along the meander-shaped portions 13 to 15.

The conductive portions 16 and 17 are connected to the lead wire 6 through a switching element such as a TFT 22, the conductive portions 18 and 19 are connected to the high-voltage side power supply line 10 through a switching element such as a TFT 23, and the conductive portions 20 and 21 are connected to the low-voltage side power supply line 11 through a switching element such as a TFT 24. Connecting portions 25 formed by the second conductive film connect the conductive portions 16 and 17, the conductive portions 18 and 19, and the conductive portions 20 and 21, respectively. The TFTs 22 and 23 are of a P-channel type, and the TFT 24 is of an N-channel type. A gate of the TFTs 22 and 23 is formed from the first conductive film, and is connected to the low-voltage side power supply line 11 through connecting wiring 26. A gate of the TFT 24 is formed from the first conductive film, and is connected to the high-voltage side power supply line 10 through connecting wiring 27. The connecting wiring 26 and 27 are formed from the first conductive film.

The actions and effects of the array substrate 1 are described hereunder.

Figure 4:
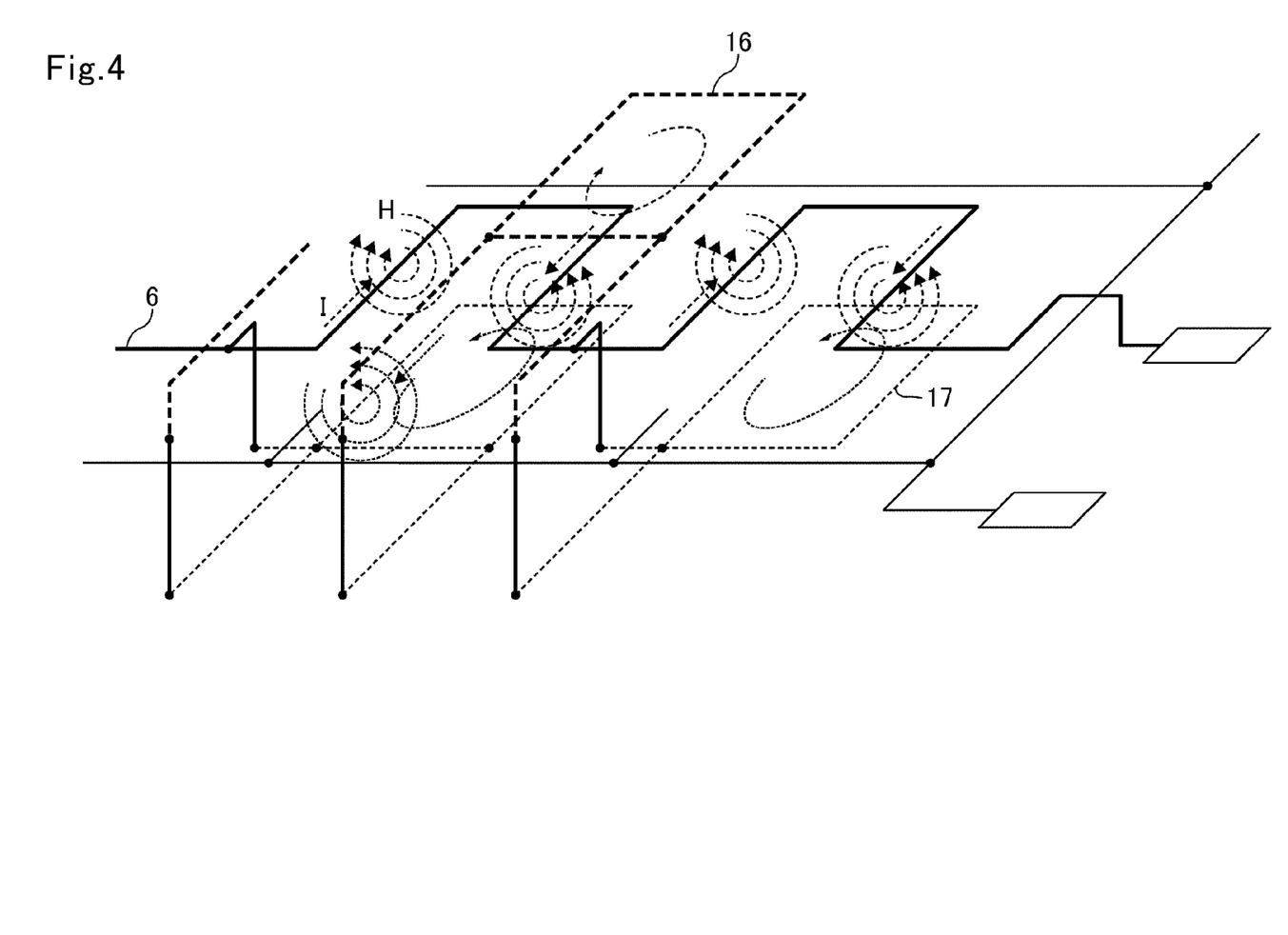
FIG. 4 is a view that illustrates a state in which a surge current has flowed into a lead wire in the configuration shown in FIG. 3.

First, in the manufacturing process, since a power supply voltage is not supplied to the power supply lines 10 and 11, the TFTs 22 to 24 are in an off state. More specifically, the conductive portions 16 to 21 are in an electrically insulated state during the manufacturing process. Accordingly, for example, as shown in FIG. 4, in the manufacturing process, if a surge current (large current) I caused by discharge of static electricity (an electrostatic charge) or the like enters the lead wire 6, an RLC circuit is formed by the lead wire 6 and the conductive portions 16 and 17 that are above and below the lead wire 6, and an attenuation function is manifested by the conductive portions 16 and 17. Specifically, a current is induced in the conductive portions 16 and 17 so that a magnetic field is generated that cancels out a magnetic field H produced by the surge current I, and the energy of the surge current I is also distributed to the conductive portions 16 and 17. The inductive energy is gradually converted to heat and dissipated by the resistance of the conductive portions 16 and 17 that are annular wirings. A similar attenuation function is also manifested when a surge current enters the power supply lines 10 and 11. Thus, according to the array substrate 1, a surge current value can be suppressed even without forming a short ring (a protective short ring or a circumferential guard ring: antistatic short-circuit wiring that is disposed at the substrate circumference), and the occurrence of panel damage due to electrostatic destruction during the manufacturing process can be suppressed.

On the other hand, when driving the array substrate 1, for example, at a stage when the product is completed, since a power supply voltage is supplied to the power supply lines 10 and 11, an on-state voltage is also applied to the gates of the TFTs 22 to 24, and as a result the TFTs 22 to 24 enter an on state. That is, when the substrate is driven, a state is entered in which the conductive portions 16 to 21 are connected to the lead wire 6 and the power supply lines 10 and 11, respectively. Accordingly, when the substrate is driven, the conductive portions 16 to 21 function as the respective auxiliary wirings of the lead wire 6 and the power supply lines 10 and 11, and the above described RLC circuit is broken up. As a result, when the substrate is driven, a signal delay does not occur in the lead wire 6 and the power supply lines 10 and 11, and a decline in the display quality of the display device can be suppressed.

Since destruction caused by a surge current occurs rapidly at a speed of several nanoseconds ($10^{-9}$ s), the destruction can not be tracked by the normal operations of the transistor. Therefore, under a manufacturing process environment in which an electrostatic countermeasure is implemented, the substrate is controlled so as to be in a non-charged state, and a transistor that constitutes a conventional protection circuit is in an off state in a normal environment. Since the resistance to static electricity of important circuits inside the array substrate 1 is normally not high, in the event of a surge current entering therein, the surge current will reach these circuits and cause damage before a transistor constituting a conventional protection circuit operates. Similarly to a conventional protection circuit, the TFTs 22 to 24 that operate at a speed of several microseconds ($10^{-6}$ s) remain in an off state in a normal environment, and hence by inducing the large current from the main wires to a ring current field that is wired in an annular shape through the insulating layer, the energy of the static electricity can be shifted from the main wires (lead wire 6, and power supply line 10 or 11) to a loop pattern (conductive portions 16 to 21) side. Part of the shifted energy is gradually converted to heat by consumption caused by the resistance of the annular wiring and the like, and another certain part thereof is delayed and flattened when returning to the main wires again. By attenuating a huge amount of momentary destructive energy that had been held by static electricity in this manner, important circuits on the side of the main wires can be protected from electrostatic destruction. On the other hand, under an actual driving environment, a rectangular pulse wave (rectangular wave) that inverts at a frequency (f) of several MHz is input for display or driving control, and a decline in the display quality may be caused by a delay of the rectangular wave that is caused by interference of a capacitance component that has been added to the lead wire 6 which results in blunting of the waveform of the rectangular wave. Therefore, under an actual driving environment, as described above, delays are avoided by placing the TFTs 22 to 24 in an on state to bring the conductive portions 16 to 21 into a state of electrical conduction with the main wires, to thereby nullify the capacitance component. Further, the occurrence of disconnection failures can be prevented by redundant use of the conductive portions 16 to 21 as parallel wiring.

Further, the conductive portions 16 to 21 do not increase the conventional area of a display device by being newly disposed in the display device, but rather are disposed in regions that originally do not have a high level of convenience, such as the upper layers or lower layers of the lead wire 6 and the power supply lines 10 and 11, and are disposed in a form in which the conductive portions 16 to 21 overlap therewith. In addition, the meander-shaped portions 13 to 15 can be formed along a conventional linear wiring pattern, and it is not necessary to form a large-scale pattern at the outer circumference of the substrate as in the examples described in Patent Document 2 and 3. Furthermore, unlike a case in which an electrostatic countermeasure is implemented using a short ring disposed at the circumference of the substrate, it is not necessary to extend a lead wire towards the outside of a panel formation region to connect with a short ring, and a setting condition for a cutting margin when dividing a substrate can be relaxed by an extent that is less than even 1 mm. Thus, according to the present embodiment, the protection circuit 12 can be formed without enlarging the picture-frame region.

Further, the conductive portions 16, 18, and 20 and the conductive portions 17, 19, and 21 are disposed in an alternate arrangement, respectively. That is, the conductive portion 16 on the upper layer and the conductive portion 17 on the lower layer are alternately arranged along the lead wire 6, the conductive portion 18 on the upper layer and the conductive portion 19 on the lower layer are alternately arranged along the power supply line 10, and the conductive portion 20 on the upper layer and the conductive portion 21 on the lower layer are alternately arranged along the power supply line 11. Therefore, since the conductive portions 16, 18, and 20 and the conductive portions 17, 19, and 21 can be efficiently disposed in the meander-shaped portions 13 to 15, the above described surge current suppression effect can be exerted more effectively.

Figure 11:
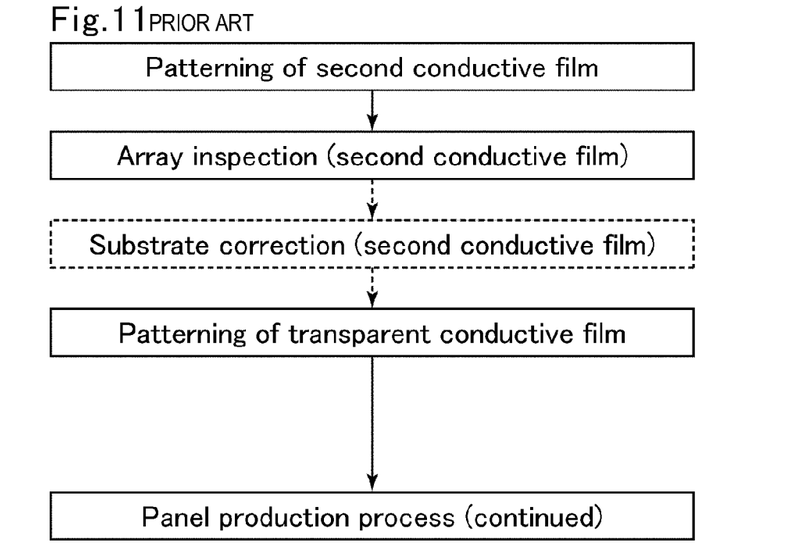
FIG. 11 is a flowchart for describing a process for manufacturing a conventional active matrix substrate.

A short ring constituted by a transparent conductive film was formed in the conventional active matrix substrate. Therefore, conventionally, as shown in FIG. 11, after a patterning process of a second conductive film, an array inspection process with respect to the second conductive film, a substrate correction process with respect to the second conductive film where necessary, and a patterning process of a transparent conductive film are performed in that order, it has not been possible to perform an array inspection process for detecting defects related to the transparent conductive film.

Figure 5:
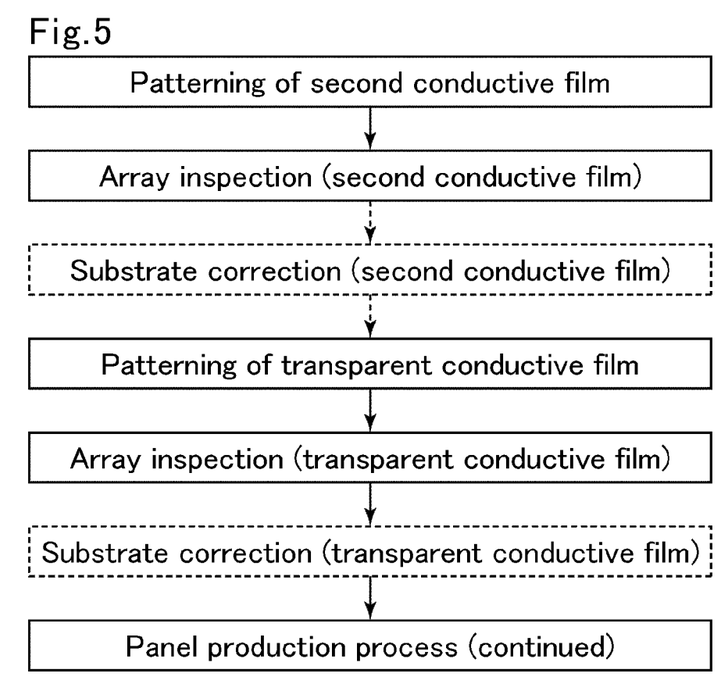
FIG. 5 is a flowchart for describing a process for manufacturing the active matrix substrate according to Embodiment 1.
Figure 6:
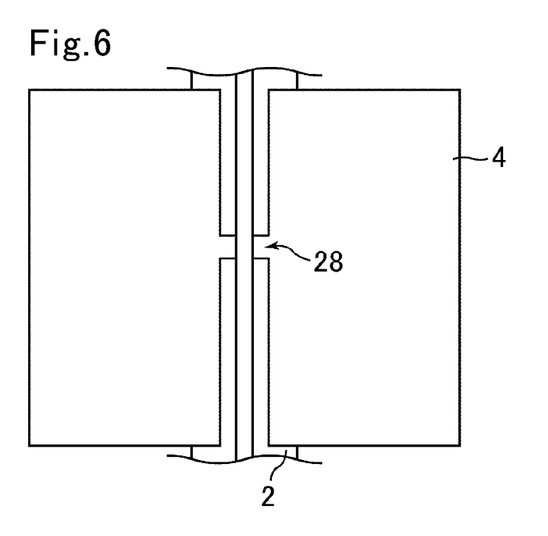
FIG. 6 is a planar schematic view illustrating a configuration of a pixel region of the active matrix substrate according to Embodiment 1.

In contrast, according to the present embodiment a short ring is not formed. Consequently, as shown in FIG. 5, after performing a patterning process of a transparent conductive film in a similar manner to the conventional process, it is possible to perform an array inspection process with respect to the transparent conductive film, and where necessary, perform a substrate correction process with respect to the transparent conductive film. For example, as shown in FIG. 6, in the substrate correction process with respect to the transparent conductive film, a leak location 28 between adjoining pixel electrodes 4 can be dealt with by a simple method that consists of disconnecting by irradiating with a laser beam (zapping). That is, defect elimination correction (correction for eliminating defective pixels) is enabled that suppresses damage to the second interlayer insulation layer that is the lower layer of the transparent conductive film to the minimum. In this connection, since the source wiring 2 composed of the second conductive film exists on the lower layer of the leak location 28, the leak location 28 can not be observed from the underside of the substrate and therefore defect elimination correction can not be performed after completion of the panel.

As described above, according to the present embodiment, since the protection circuits 12 as electrostatic countermeasures are formed in the lead wire 6 and the power supply lines 10 and 11, a short ring need not be connected to the terminals 5, 8, and 9, and since a conductor layer does not exist at an end face of a divided substrate, a leak at the end face is not a concern. Further, since inspection (and correction) of the substrate can be performed after patterning of the transparent conductive film also, it is possible to make a judgment for detecting defects that originate in the transparent conductive film, and thus defect elimination correction during an array process of the relevant defect that has been conventionally difficult to carry out is enabled. In addition, since the protection circuit 12 does not function when the substrate is being driven, the occurrence of signal delays and a decline in the display quality can be suppressed.

Note that, although in FIG. 2 the conductive portions 16 to 21 are disposed at positions that deviate from the corresponding meander-shaped portions 13 to 15 in order to facilitate the illustration, the conductive portions 16 to 21 may be overlaid on the meander-shaped portions 13 to 15 so as to pass directly over the meander-shaped portions 13 to 15. Further, the TFTs 22 and 23 may be of an N-channel type, and in such case, it is sufficient to connect the gates of the TFTs 22 and 23 to the high-voltage side power supply line 10. Further, the TFT 24 may be of a P-channel type, and in such case it is sufficient to connect the gate of the TFT 24 to the low-voltage side power supply line 11.

Figure 7:
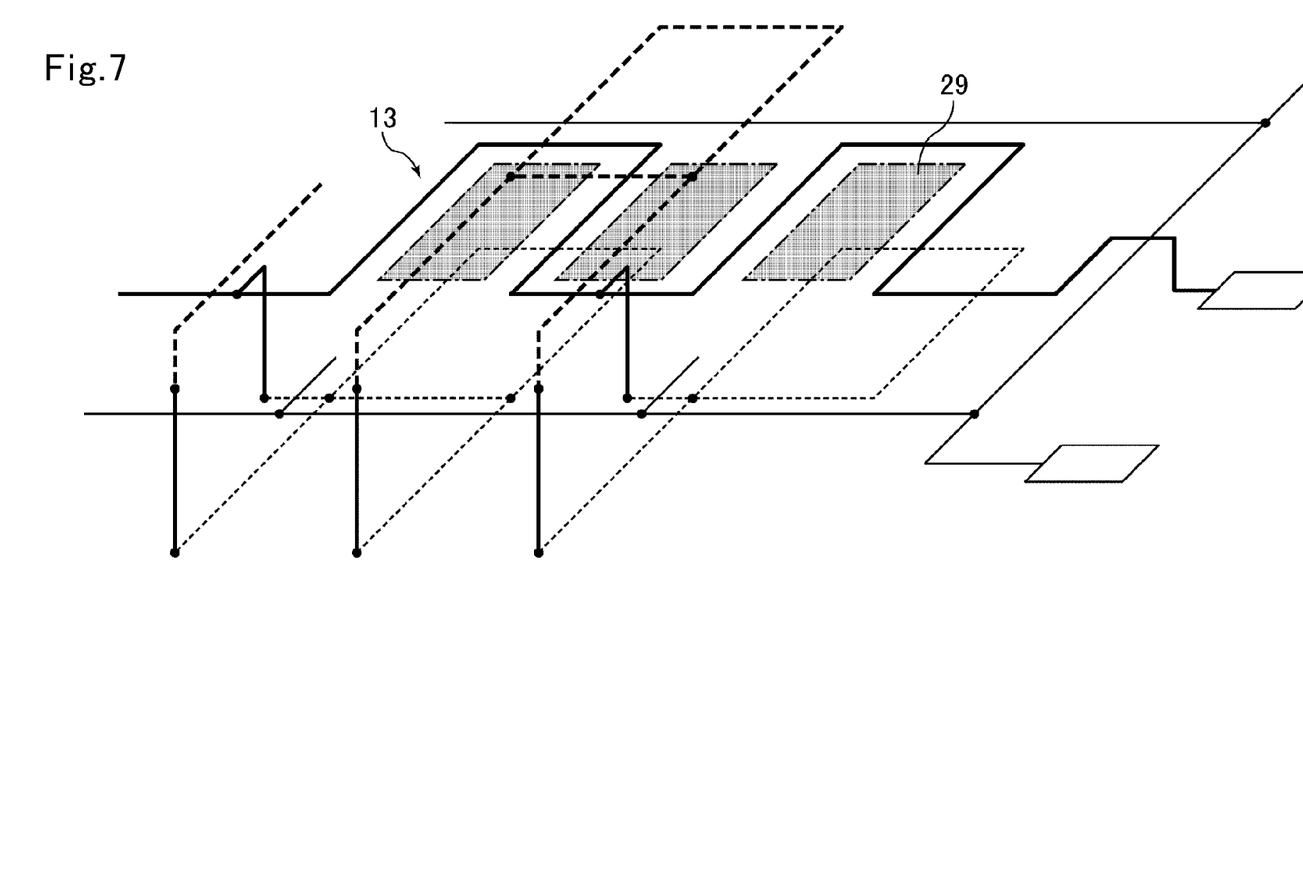
FIG. 7 is a perspective schematic view showing a configuration of a picture-frame region of a modification example of the active matrix substrate according to Embodiment 1.

As shown in FIG. 7, for example, a ferromagnetic layer 29 including a ferromagnetic material such as ZnO, BaTiO$_4$, or an Fe—Si alloy may be formed in a region surrounded by the meander structure of the meander-shaped portions 13 to 15. As a result, since a stronger magnetic field is generated, the above described surge current suppression effect can be exerted more effectively.

In this connection, the ferromagnetic layer 29 can be formed, for example, by forming a concave portion at the relevant location, and thereafter coating the ferromagnetic material inside the concave portion. The ferromagnetic layer 29 may also be formed by doping the first and/or second interlayer insulation layer of the relevant portion with a ferromagnetic material. Alternatively, a magnetic property may be manifested by a method such as coating with a photoinduced-magnetic material or the like, and thereafter subjecting only a specific region of the material to photoinduction.

The ferromagnetic layer 29 may also be formed in a region that is surrounded by the conductive portions 16 to 21.

A ferrimagnetic substance or an antiferromagnetic substance may be disposed in the ferroelectric layer 29.

Embodiment 2

According to the present embodiment, the only difference with respect to Embodiment 1 is the configuration of the protection circuit, and hence a description of contents that are duplicated in the two embodiments is omitted. Further, in the drawings, members that exert the same functions in the two embodiments are denoted by the same reference symbols.

Figure 8:
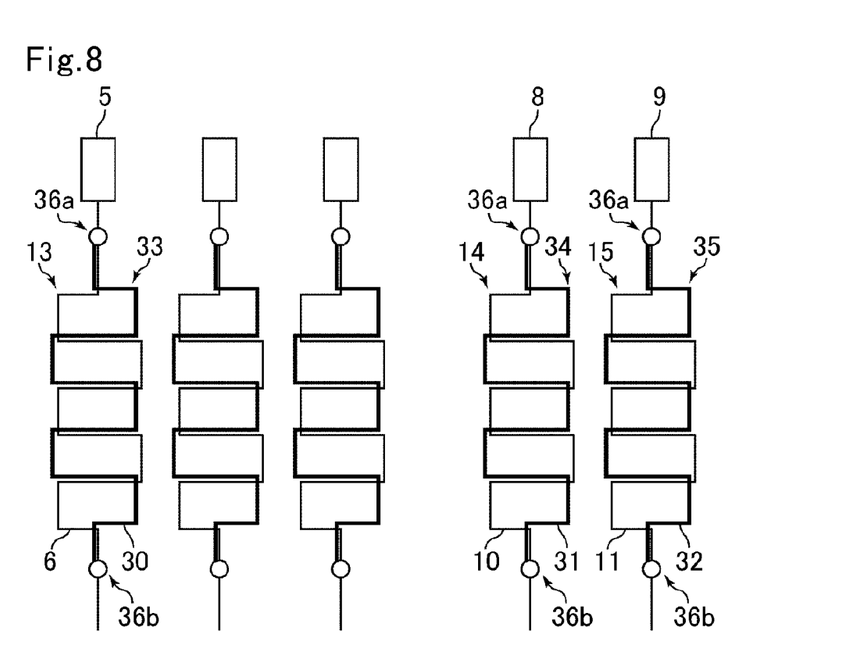
FIG. 8 is a planar schematic view showing a configuration of a picture-frame region of an active matrix substrate according to Embodiment 2.

As shown in FIG. 8, similarly to Embodiment 1, each lead wire 6 and the power supply lines 10 and 11 have meander-shaped portions 13, 14 and 15, respectively. The lead wires 6 and the power supply lines 10 and 11 are formed by the first conductive film.

Auxiliary wirings 30, 31 and 32 are formed through the first interlayer insulation layer on the upper layers of the lead wire 6 and power supply lines 10 and 11, respectively. The auxiliary wirings 30 to 32 are formed by the second conductive film. The auxiliary wirings 30 to 32 have meander-shaped portions 33, 34 and 35. The meander-shaped portions 33 to 35 meander in the manner of square waves. The meander shape of the meander-shaped portions 33 to 35 is inverted relative to the meander shape of the meander-shaped portions 13 to 15. More specifically, the shapes of the meander-shaped portions 13 to 15 and the meander-shaped portions 33 to 35 are mirror symmetrical, or resemble shapes that are mirror symmetrical. Thus, although the auxiliary wirings 30 to 32 are arranged with the same or approximately the same cycle (the same cycle is preferable) as the meander shape of the meander-shaped portions 13 to 15, the auxiliary wirings 30 to 32 are arranged in the opposite direction to the meander shape of the meander-shaped portions 13 to 15. Further, a part of the meander shape of the meander-shaped portions 33 to 35 is arranged along the meander shape of the meander-shaped portions 13 to 15. Thus, in the meander-shaped portions 13 to 15 and the meander-shaped portions 33 to 35, portions that extend laterally (in the vertical direction) with respect to the original direction of progress run side-by-side. Further, in the meander-shaped portions 13 to 15 and the meander-shaped portions 33 to 35, two square waves that are in opposite phase to each other are arranged so as to overlap.

Two switches such as semiconductor switches 36a and 36b are formed in the lead wire 6 and the power supply lines 10 and 11, respectively, so as to sandwich the meander-shaped portions 13 to 15.

Figure 9:
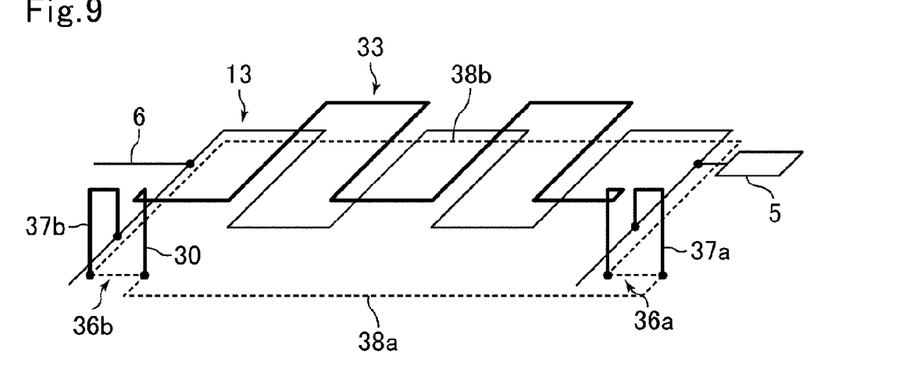
FIG. 9 is a perspective schematic view showing a configuration of a picture-frame region of the active matrix substrate according to Embodiment 2.

As shown in FIG. 9, the semiconductor switches 36a and 36b are composed of a TFT, and in each of the semiconductor switches 36a and 36b, one of the source and the drain, and the gate are short-circuited through a connecting portion 37a or 37b formed from the second conductive film. The respective gates of the semiconductor switches 36a and 36b and the lead wire 6 and the power supply line 10 or 11 are connected by being integrally formed using the first conductive film. In each of the semiconductor switches 36a and 36b, the other of the source and the drain is connected to the auxiliary wiring 30, 31 or 32. The connecting portion 37a connected to the semiconductor switch 36a is connected to one end of the auxiliary wiring 30, 31 or 32 through a high-resistance semiconductor layer 38a. The connecting portion 37b connected to the semiconductor switch 36b is connected to another end of the auxiliary wiring 30, 31 or 32 through a high-resistance semiconductor layer 38b. The high-resistance semiconductor layers 38a and 38b are formed from the semiconductor layer. More specifically, the high-resistance semiconductor layers 38a and 38b are an n$^-$ layer or a p layer that has been doped with a low-concentration impurity to obtain a resistivity of approximately 1 Ωcm.

The resistance values of the high-resistance semiconductor layers 38a and 38b are high compared to the resistance values of the various kinds of conductive films that are a resistivity in a region of approximately 10 to 200 μΩcm, and are set in the vicinity of the middle between a resistance value in an on state and a resistance value in an off state of a semiconductor switch whose resistance changes by around 6 digits or more between an on state and an off state. Thus, when the semiconductor switch is in an on state, it is difficult for a current to flow in the direction of the high-resistance semiconductor layers 38a and 38b, and the current can easily flow directly into the auxiliary wiring 30, 31 or 32, and hence a surge current attenuation effect is exerted between the lead wire 6 and power supply line 10 or 11 and the auxiliary wiring 30, 31 or 32. On the other hand, when the semiconductor switch is in an off state, that is, in an actual driving state, since a current in the auxiliary wiring 30, 31 or 32 flows after bypassing the high-resistance semiconductor layers 38a and 38b, the current flows in the opposite direction to the direction of current flowing in the lead wire 6 and power supply line 10 or 11, and it is difficult for an effect that delays a driving signal to occur.

A threshold value of the semiconductor switches 36a and 36b is adjusted so that the semiconductor switch enters an on state when a surge current flows therein, and enters an off state when at least one of a power supply voltage and a signal is input.

According to the array substrate of the present embodiment, for example, if a surge current that arises on the substrate surface flows into the lead wire 6, although a surge current enters into the lead wire 6, the two semiconductor switches 36a and 36b are placed in an on state. Therefore, a surge current also flows inside the auxiliary wiring 30 that is a detour. Subsequently, two magnetic fields are generated in accordance with Ampere's corkscrew rule by the surge currents flowing through the meander-shaped portion 13 and the meander-shaped portion 33, respectively. At this time, since the meander-shaped portion 13 has a meander shape that is inverted relative to the shape of the meander-shaped portion 33, the two magnetic fields act to cancel out each other, and mutually function to inhibit entry of a surge current. A similar delay function is also manifested in a case where a surge current enters the power supply lines 10 and 11. Accordingly, without forming a short ring, a large current and/or a large voltage that is momentarily applied to the array substrate can be flattened (suppressed), and high-definition devices (TFTs for pixel switching, TFTs included in a logic circuit and the like) inside the substrate can be protected.

In contrast, when the array substrate is being driven normally, only a comparatively low voltage such as an image signal, a scanning signal, or a power supply voltage is applied to the two semiconductor switches 36a and 36b. Accordingly, at the time of normal driving, the semiconductor switches 36a and 36b enter an off state and the auxiliary wirings 30 to 32 enter an electrically floating state. Therefore, at the time of normal driving, the above described delay function is not manifested, and occurrence of a signal delay in the lead wire 6 and power supply lines 10 and 11 can be suppressed. Consequently, it is possible to suppress the occurrence of a signal delay in the lead wire 6 and power supply lines 10 and 11, and suppress a decline in the display quality of the display device.

Figure 12:
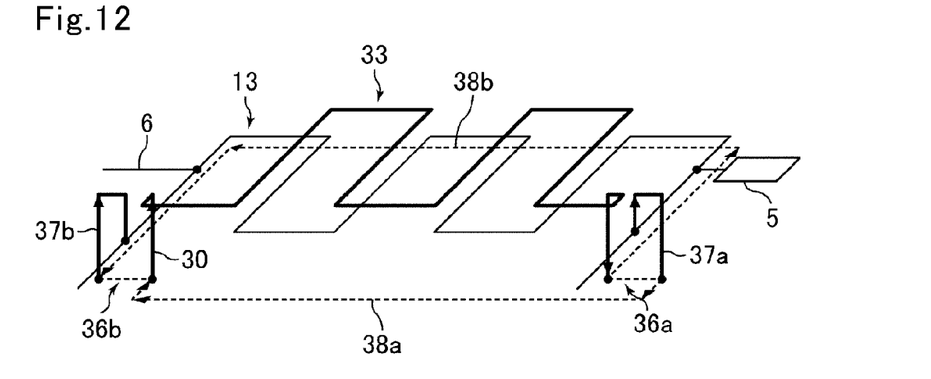
FIG. 12 is a perspective schematic view showing a configuration of the picture-frame region of the active matrix substrate according to Embodiment 2, which shows a semiconductor switch in an off state.

In an equivalent circuit of the protection circuit of Embodiment 2, two solenoid coils that are wound in opposite directions are disposed side-by-side, and the two ends of each solenoid coil are connected with a depletion-type TFT, and it is considered that there are two kinds of states for the equivalent circuit: (1) a state in which the two ends of the two coils are connected with a resistance (voltage non-application state), and (2) a state in which the two coils are connected by cross wiring (voltage application state, i.e., a time of normal driving). If a surge current enters during a non-application state, transient currents in the same direction that flow inside the two coils are attenuated in a reciprocal manner by the other coil. When driving at the time of normal use, a depletion-type TFT changes to a high resistance state when a voltage is applied, and as shown by the arrows in FIG. 12, a reverse current flows inside the two coils (lead wire 6, power supply line 10 or 11, and auxiliary wiring 30, 31 or 32) through the cross-wired, high-resistance semiconductor layer 38a or 38b. By making the winding directions of the two solenoid coils opposite to each other, it is considered that if currents flow in the same direction inside the two coils, the currents will cancel each other out, while if currents flow in opposite directions inside the two coils, the currents will not cancel each other out.

The auxiliary wirings 30 to 32 are disposed on the upper layer or lower layer of the lead wire 6 and the power supply lines 10 and 11 that do not have a high level of convenience, and are disposed in a form in which the auxiliary wirings 30 to 32 overlap therewith. In addition, the meander-shaped portions 13 to 15 can be formed along a conventional linear wiring pattern, and it is not necessary to form a large-scale pattern at the outer circumference of the substrate as in the examples described in Patent Document 2 and 3. Furthermore, unlike a case in which an electrostatic countermeasure is implemented using a short ring disposed at the circumference of the substrate, it is not necessary to extend a lead wire towards the outside of a panel formation region to connect with a short ring, and a setting condition for a cutting margin when dividing a substrate can be relaxed by an extent that is less than even 1 mm. Thus, according to the present embodiment, the protection circuit 12 can be formed without enlarging the picture-frame region.

In addition, because the meander shape of the meander-shaped portions 13 to 15 and the meander shape of the meander-shaped portions 33 to 35 are completely or substantially mirror symmetrical, the meander-shaped portions 13 to 15 can be efficiently aligned with the meander-shaped portions 33 to 35. Therefore, the aforementioned surge current suppression effect can be exerted more effectively.

The static electricity resistance of a semiconductor device generally depends on the channel width W/channel length L. Therefore, it is preferable that the semiconductor switches 36a and 36b are of a larger scale than the TFTs for pixel switching and a TFT included in the logic circuit 7. Thus, even if a surge current of a large capacity arises, the semiconductor switches 36a and 36b can have resistance thereto. More specifically, for example, it is sufficient to make a setting such that in the semiconductor switches 36a and 36b, W/L is equal to 200 μm/4 μm, while in a TFT for pixel switching, W/L is equal to 20 μm/4 μm.

As a switch with which an effect that is equal to that of a semiconductor device can be expected, a varistor including ZnO or the like may be provided instead of the semiconductor switches 36a and 36b.

A parallel circuit of a NOT circuit (turns off when a voltage is applied, and turns on when a voltage is not applied) and a high-pass filter (high frequencies pass therethrough) may also be used as a switch.

Note that, although in FIG. 8 the auxiliary wirings 30 to 32 are disposed at positions that deviate from the corresponding meander-shaped portions 13 to 15 in order to facilitate the illustration, the auxiliary wirings 30 to 32 may be overlaid on the meander structure of the meander-shaped portions 13 to 15 so as to pass directly over the meander-shaped portions 13 to 15.

Although the auxiliary wirings 30 to 32 may by formed by the transparent conductive film, it is preferable that the resistance values of the meander-shaped portions 13 to 15 and the meander-shaped portions 33 to 35 are close. Therefore, it is preferable that one set of meander-shaped portions among the meander-shaped portions 13 to 15 and the meander-shaped portions 33 to 35 is formed from the first conductive film and the other set of meander-shaped portions is formed from the second conductive film. Thus, the lead wire 6, and the power supply lines 10 and 11 (meander-shaped portions 13 to 15) may be formed by the second conductive film, and the auxiliary wirings 30, 31 and 32 (meander-shaped portions 33 to 35) may be formed by the first conductive film.

Embodiments 1 and 2 may also be combined with each other. For example, the protection circuit of Embodiment 1 and the protection circuit of Embodiment 2 may be formed on the same insulating substrate. Further, a ferromagnetic layer may be formed in a region surrounded by a meander-shaped portion in Embodiment 2.

Although a liquid crystal display device is described as a specific example according to Embodiments 1 and 2, it is sufficient that the array substrate of Embodiment 1 and 2 is used in a display device in which a plurality of pixels are formed in a matrix shape, and for example, the array substrate of Embodiment 1 and 2 may also be applied to an organic EL display.

The present application claims priority to Patent Application No. 2009-210711 filed in Japan on Sep. 11, 2009 under the Paris Convention and provisions of national law in a designated State, the entire contents of which are hereby incorporated by reference.

EXPLANATION OF SYMBOLS

1: Array substrate
2: Source wiring
3: Gate wiring
4: Pixel electrode
5: Input terminal
6: Lead wire
7: Logic circuit
8, 9: Power supply terminal
10: High-voltage side power supply line
11: Low-voltage side power supply line
12: Protection circuit
13 to 15, 33 to 35: Meander-shaped portion
16 to 21: Conductive portion
22 to 24: TFT
25, 37a, 37b: Connecting portion
26, 27: Connecting wiring
28: Leak location
29: Ferromagnetic layer
30 to 32: Auxiliary wiring
36a, 36b: Semiconductor switch
38a, 38b: High-resistance semiconductor layer
150: Short ring

The invention claimed is:

1. An active matrix substrate on which a plurality of pixels are formed in a matrix shape, comprising, on one principal surface side of the substrate:
a terminal,
a semiconductor element,
wiring that is formed in a picture-frame region of the substrate and that connects the terminal and the semiconductor element, and
an annular conductive portion formed through an insulation layer on at least one of an upper layer side and a lower layer side of the wiring;
wherein:
the wiring comprises a meander structure including a meander-shaped portion; and
a part of the conductive portion is disposed along the meander-shaped portion.

2. The active matrix substrate according to claim 1, further comprising:
a power supply line to which a power supply voltage is applied, and
a field-effect transistor that connects the wiring and the conductive portion;
wherein:
the field-effect transistor is controlled by a gate of the transistor being connected to the power supply line; and
the field-effect transistor has a switchable function such that the field-effect transistor enters an off state in a state in which the power supply voltage is not applied and enters an on state in a state in which the power supply voltage is applied.

3. The active matrix substrate according to claim 2, wherein:
the field-effect transistor is of an N-channel type;
the power supply line includes a low-voltage side power supply line and a high-voltage side power supply line; and
the gate is connected to the high-voltage side power supply line.

4. The active matrix substrate according to claim 2, wherein:
the field-effect transistor is of a P-channel type;
the power supply line includes a low-voltage side power supply line and a high-voltage side power supply line; and
the gate is connected to the low-voltage side power supply line.

5. The active matrix substrate according to claim 1, wherein:
the active matrix substrate comprises a plurality of the conductive portions;
the plurality of conductive portions include a conductive portion formed on an upper layer side of the wiring, and a conductive portion formed on a lower layer side of the wiring; and
the conductive portion formed on the upper layer side of the wiring and the conductive portion formed on the lower layer side of the wiring are alternately arranged along the wiring.

6. The active matrix substrate according to claim 1, wherein a portion surrounded by the meander-shaped portion includes a ferromagnetic material.

7. An active matrix substrate on which a plurality of pixels are formed in a matrix shape, comprising, on one principal surface side of the substrate:
a terminal,
a semiconductor element,
wiring that is formed in a picture-frame region of the substrate, and that connects the terminal and the semiconductor element, and
auxiliary wiring that is formed through an insulation layer on an upper layer side or a lower layer side of the wiring;
wherein:
the auxiliary wiring is connectable with the wiring at two different points;
the wiring and the auxiliary wiring each comprise a meander structure including a meander-shaped portion between the two points;
the meander-shaped portion of the wiring and the meander-shaped portion of the auxiliary wiring are arranged with a same or substantially same cycle;
the meander-shaped portion of the auxiliary wiring is disposed in an inverse direction relative to the meander-shaped portion of the wiring from one of the two points to another of the two points; and
a part of the meander-shaped portion of the auxiliary wiring is disposed along the meander-shaped portion of the wiring.

8. The active matrix substrate according to claim 7, further comprising two switches that connect the wiring and the auxiliary wiring at the two points;
wherein a connection by the two switches has a switchable function such that an on state is entered when a surge current flows therein, and an off state is entered when at least one of a power supply voltage and a signal is input.

9. The active matrix substrate according to claim 7, wherein the meander-shaped portion of the auxiliary wiring and the meander-shaped portion of the wiring are completely or substantially mirror symmetrical.

10. The active matrix substrate according to claim 7, wherein each of the two switches is a semiconductor switch.

11. The active matrix substrate according to claim 7, wherein a portion surrounded by the meander-shaped portion of the wiring includes a ferromagnetic material.

* * * * *